United States Patent
Lefevre

(10) Patent No.: US 8,519,696 B2
(45) Date of Patent: Aug. 27, 2013

(54) INTEGRATED CIRCUITS WITH FREQUENCY GENERATING CIRCUITS

(75) Inventor: Francois Lefevre, Herouvillette (FR)

(73) Assignee: NXP B.V., Eindhoven (NL)

( * ) Notice: Subject to any disclaimer, the term of this patent is extended or adjusted under 35 U.S.C. 154(b) by 271 days.

(21) Appl. No.: 13/111,710

(22) Filed: May 19, 2011

(65) Prior Publication Data

US 2011/0285436 A1   Nov. 24, 2011

(30) Foreign Application Priority Data

May 21, 2010  (EP) ..................................... 10290270

(51) Int. Cl.
*G01R 19/00*  (2006.01)

(52) U.S. Cl.
USPC ................... 324/76.11; 324/76.23; 324/76.43; 324/76.51; 324/76.79; 324/76.81; 324/76.39; 445/150.1; 445/192.1; 445/195.1; 445/196.1; 445/226.1

(58) Field of Classification Search
USPC .......... 324/76.11, 76.23, 76.43, 76.51, 76.79, 324/76.81, 76.39; 455/150.1, 192.1, 195.1, 455/196.1, 226.1, 313, 318, 323
See application file for complete search history.

(56) References Cited

U.S. PATENT DOCUMENTS

| | | | | |
|---|---|---|---|---|
| 4,709,407 A | * | 11/1987 | Baba ........................... | 455/226.1 |
| 5,327,582 A | * | 7/1994 | Wong .............................. | 455/76 |
| 5,642,039 A | * | 6/1997 | Bradley et al. ............. | 324/76.53 |
| 5,825,254 A | * | 10/1998 | Lee ................................. | 331/25 |
| 5,857,004 A | * | 1/1999 | Abe ............................... | 375/344 |
| 5,870,439 A | * | 2/1999 | Ben-Efraim et al. ......... | 375/346 |
| 5,983,070 A | * | 11/1999 | Georges et al. .................. | 725/78 |
| 6,064,694 A | * | 5/2000 | Clark et al. .................... | 375/224 |
| 6,154,166 A | * | 11/2000 | Sawada et al. ................... | 342/20 |
| 6,215,989 B1 | * | 4/2001 | Otaka ........................ | 455/234.1 |
| 6,490,441 B1 | * | 12/2002 | Saito .......................... | 455/183.1 |
| 6,690,921 B1 | * | 2/2004 | Nagayama et al. ........ | 455/67.14 |
| 6,728,523 B1 | * | 4/2004 | Ohba et al. ................. | 455/182.2 |
| 6,728,528 B1 | * | 4/2004 | Loke ............................. | 455/318 |
| 6,768,902 B1 | * | 7/2004 | Kajita ........................... | 455/313 |
| 6,895,229 B2 | | 5/2005 | Schetelig et al. | |
| 6,901,248 B1 | * | 5/2005 | Cowley ........................ | 455/313 |
| 6,961,553 B2 | * | 11/2005 | Zhao et al. .................... | 455/311 |
| 6,985,188 B1 | * | 1/2006 | Hurst, Jr. ...................... | 348/553 |
| 7,068,740 B2 | * | 6/2006 | Stevenson .................... | 375/334 |
| 7,088,973 B2 | * | 8/2006 | Loke ............................. | 455/130 |
| 7,603,089 B2 | * | 10/2009 | Strandberg et al. ............. | 455/91 |
| 7,817,977 B1 | * | 10/2010 | Yee et al. ...................... | 455/260 |

(Continued)

OTHER PUBLICATIONS

Erdogan et al., "Diagnosis of Assembly Failures for System-in-Package RF Tuners", IEEE International Circuits and Systems, May 18-21, 2008, p. 2286-2289.*

(Continued)

*Primary Examiner* — Arleen M Vazquez
*Assistant Examiner* — Lamarr Brown

(57) ABSTRACT

An integrated circuit comprises at least first and second frequency generating circuits, wherein each frequency generating circuit comprises a reference frequency source; a voltage controlled oscillator; and a feedback control circuit for controlling the voltage controlled oscillator to provide a desired output frequency signal. The output of the voltage controlled oscillator of the first frequency generating circuit is switched into the feedback control circuit of the second frequency generating circuit to provide a test signal for testing one or more components of the feedback control circuit of the second frequency generating circuit.

10 Claims, 3 Drawing Sheets

(56) References Cited

U.S. PATENT DOCUMENTS

| | | | |
|---|---|---|---|
| 7,907,922 B2* | 3/2011 | Lee et al. | 455/130 |
| 8,058,880 B2* | 11/2011 | Bradley et al. | 324/520 |
| 8,180,313 B2* | 5/2012 | Kim et al. | 455/326 |
| 8,213,889 B2* | 7/2012 | Shin et al. | 455/132 |
| 2002/0086654 A1* | 7/2002 | Cowley et al. | 455/343 |
| 2003/0083025 A1* | 5/2003 | Maruo et al. | 455/113 |
| 2003/0119474 A1* | 6/2003 | Kimura | 455/333 |
| 2003/0125006 A1* | 7/2003 | Miya et al. | 455/323 |
| 2004/0077328 A1* | 4/2004 | Fujita | 455/323 |
| 2004/0100294 A1 | 5/2004 | Toner | |
| 2004/0204036 A1* | 10/2004 | Yang | 455/553.1 |
| 2004/0219901 A1* | 11/2004 | Loke | 455/318 |
| 2004/0259512 A1* | 12/2004 | Busson et al. | 455/190.1 |
| 2004/0259518 A1* | 12/2004 | Aktas et al. | 455/323 |
| 2005/0153677 A1* | 7/2005 | Vorenkamp et al. | 455/340 |
| 2006/0058001 A1* | 3/2006 | Minnis et al. | 455/334 |
| 2006/0116098 A1* | 6/2006 | Oba et al. | 455/313 |
| 2006/0141963 A1* | 6/2006 | Maxim et al. | 455/192.1 |
| 2006/0141964 A1* | 6/2006 | Otaka et al. | 455/232.1 |
| 2006/0233112 A1 | 10/2006 | Demmerle | |
| 2006/0293012 A1* | 12/2006 | Jo et al. | 455/264 |
| 2007/0026835 A1* | 2/2007 | Yamaji et al. | 455/318 |
| 2007/0054649 A1* | 3/2007 | Hattori | 455/323 |
| 2007/0077902 A1* | 4/2007 | Imae et al. | 455/151.3 |
| 2007/0077908 A1* | 4/2007 | Vorenkamp et al. | 455/323 |
| 2007/0155355 A1* | 7/2007 | Lynch | 455/323 |
| 2007/0178870 A1* | 8/2007 | Kerth | 455/313 |
| 2007/0264958 A1* | 11/2007 | Lin | 455/318 |
| 2008/0090542 A1* | 4/2008 | Leistner et al. | 455/313 |
| 2008/0254755 A1* | 10/2008 | Kato | 455/118 |
| 2008/0261548 A1* | 10/2008 | Krone | 455/205 |
| 2009/0023412 A1* | 1/2009 | Meijer et al. | 455/313 |
| 2009/0110035 A1* | 4/2009 | Sutton et al. | 375/146 |
| 2009/0111419 A1* | 4/2009 | Gard et al. | 455/323 |
| 2009/0160430 A1* | 6/2009 | Brown et al. | 324/76.23 |
| 2009/0233570 A1* | 9/2009 | Wang | 455/323 |
| 2009/0258629 A1* | 10/2009 | Ritchey et al. | 455/313 |
| 2009/0270062 A1* | 10/2009 | Mu et al. | 455/323 |
| 2009/0298422 A1* | 12/2009 | Conroy et al. | 455/12.1 |
| 2010/0056086 A1* | 3/2010 | Suominen | 455/150.1 |
| 2010/0056088 A1* | 3/2010 | Suominen | 455/192.3 |
| 2010/0085031 A1* | 4/2010 | Dobberpuhl et al. | 323/318 |
| 2010/0285769 A1* | 11/2010 | Conroy et al. | 455/318 |
| 2010/0311382 A1* | 12/2010 | Umeda et al. | 455/313 |
| 2010/0317312 A1* | 12/2010 | Lee et al. | 455/313 |
| 2010/0330945 A1* | 12/2010 | Handa et al. | 455/266 |
| 2011/0001468 A1* | 1/2011 | Aoyama et al. | 324/76.39 |
| 2011/0059709 A1* | 3/2011 | Collins, III | 455/226.1 |
| 2011/0065406 A1* | 3/2011 | Feng | 455/296 |
| 2011/0086606 A1* | 4/2011 | Chen et al. | 455/323 |
| 2011/0092169 A1* | 4/2011 | Savoj | 455/73 |
| 2011/0117869 A1* | 5/2011 | Woodings | 455/226.4 |
| 2011/0212698 A1* | 9/2011 | Le Guillou et al. | 455/196.1 |
| 2011/0306314 A1* | 12/2011 | Noujeim et al. | 455/226.1 |
| 2012/0003948 A1* | 1/2012 | Lackey | 455/226.1 |

OTHER PUBLICATIONS

Extended European Search Report for European Patent Application No. 10290270.7 (Oct. 20, 2010).

* cited by examiner

INTEGRATED CIRCUITS WITH FREQUENCY GENERATING CIRCUITS

CROSS-REFERENCE TO RELATED APPLICATIONS

This application claims the priority under 35 U.S.C. §119 of European patent application no. 10290270.7, filed on May 21, 2010, the contents of which are incorporated by reference herein.

This invention relates to integrated circuits which include frequency generating circuits.

One example is silicon tuners, which are widely use in RF transmit and receive circuitry. To further improve integration and reduce size and cost of the final customer application, silicon tuners incorporate more and more features. Image rejection auto-calibration, RF filter autocalibration, or even two RF streams are common features for such products.

These additional features require at least two integrated oscillators (phase locked loops) inside the IC. One oscillator provides the local oscillator for the mixer function to down-convert the RF signal to lower intermediate frequencies. The other is used for calibration purposes and/or for a dual stream down conversion. When used for calibration purposes, the second oscillator replaces the application RF signal. The aim is to tune an RF filter using a specific algorithm or to calibrate the image rejection of the mixer using amplitude and phase correction features.

Whatever the purpose of the oscillators integrated inside the IC, they typically include several blocks including a voltage controlled oscillator, a loop filter with a charge pump, a crystal reference frequency circuit, and some dividers.

In order to guarantee the functionality and the performance of the device to the customer, all blocks should be checked using an industrial test operation.

For example, the dividers are checked with closed loop tests but also as stand alone dividers. For this purpose, an external RF signal with a known and accurate frequency feeds the divider and the output divided frequency is measured. Then the ratio (input frequency/output frequency) is checked to ensure proper divider function.

The known and accurate frequency feeding the divider of the device under test is provided by an expensive RF source installed inside the industrial tester, to a dedicated test pin. This leads to increased test cost and therefore to product cost increases.

As the oscillators of the IC are often not close to each other, several dedicated test pins are required to feed the dividers (one test pin for each oscillator). This requirement increases the package size and cost.

The test hardware must be able to provide one test signal for each oscillator. The test hardware (probe card or final test board) requires the reference source signal to feed the divider to be connected to the dedicated test pins of the device under test. This connection adds hardware to the test board such as RF cables, components for matching, RF switches and/or splitters. These hardware elements take space on the printed circuit board. There is therefore a limitation for testing several devices at the same time (so called multi-site testing), because the hardware for one device should be duplicated for each site tested at the same time, and the space on the probe card or final test board is limited.

Silicon tuner internal oscillators usually work at very high frequencies (6 to 9 GHz). Therefore dividers should be also tested at the same frequency range to properly check the functionality. On the other hand, tester RF sources are limited to 6 GHz or even to 3 GHz. Thus, when using an external RF reference signal provided by the tester, the divider is not tested at its functional frequency but at the maximum frequency available on the industrial tester. This limitation impairs product quality.

Thus, it can be seen that there are issues relating to industrial test cost, which translates into product cost. In particular, current test methods require an expensive tester, dedicated test pins, and set a limitation on the number of multiple tests that can be carried out simultaneously.

According to the invention, there is provided an integrated circuit comprising at least first and second frequency generating circuits, wherein each frequency generating circuit comprises:

a reference frequency source;

a voltage controlled oscillator; and a feedback control circuit for controlling the voltage controlled oscillator to provide a desired output frequency signal, wherein the integrated circuit comprises switching means for switching the output of the voltage controlled oscillator of the first frequency generating circuit into the feedback control circuit of the second frequency generating circuit to provide a test signal for testing one or more components of the feedback control circuit of the second frequency generating circuit.

The invention provides an arrangement in which one integrated oscillator is used to feed the circuit of the other for the purpose of testing. The reference frequency used for testing is thus made by the device under test itself.

This solution removes the need for an expensive external signal generator. No test pin is required to connect the external RF source to the divider, and no specific hardware is required on the test board. This enables more multi-site testing as more space is made available on the test hardware.

Moreover, the divider is tested at its functional frequency as the reference signal is now provided by a similar oscillator working at the same frequency range. This improves the quality of the test and therefore of the ultimate product.

The feedback control circuit of each frequency generating circuit can comprise a frequency divider which divides the voltage controlled oscillator output, and a comparator which compares the divider output with the reference frequency, wherein the output of the comparator is used to control the voltage controlled oscillator. Thus, the frequency generating circuit comprises a local oscillator with a phase locked loop. The divider is one example of component which can be tested, and ideally at a frequency close to that at which it will be operated.

The switching means is then for switching the output of the voltage controlled oscillator of the first frequency generating circuit to the frequency divider of the second frequency generating circuit. An output is provided, for the frequency divider output signal of the second frequency generating circuit. This provides a signal for analysis.

The reference frequency source can comprise a crystal oscillator.

The integrated circuit can comprise a tuner, in which the output of the voltage controlled oscillator of the first frequency generating circuit is provided to a mixer for mixing an RF input signal to generate an intermediate frequency output signal.

In one example, the output of the voltage controlled oscillator of the second frequency generating circuit is preferably provided to front end circuitry for processing the RF input signal before it is mixed. This provides a tuner with a separate calibration oscillator.

In another example, the integrated circuit comprises a dual stream tuner, in which the outputs of the voltage controlled oscillator of the first and second frequency generating circuits are provided to respective mixers, each for mixing an RF input signal stream to generate an intermediate frequency output signal stream.

The invention also provides a method of testing one or more components of a second frequency generating circuit of an integrated circuit which has first and second frequency generating circuits, wherein the method comprises:

switching the output of the first frequency generating circuit into a feedback control circuit of the second frequency generating circuit to provide a test signal for testing one or more components of the feedback control circuit of the second frequency generating circuit; and analysing the response of the one or more components of the feedback control circuit to the test signal.

An example of the invention will now be described with reference to the accompanying drawings, in which.

The invention provides an integrated circuit comprising at least first and second frequency generating circuits. The output of the first frequency generating circuit is switchable into a feedback control circuit of the second frequency generating circuit to provide a test signal for testing one or more components of the feedback control circuit of the second frequency generating circuit.

The invention relates to any device with several local oscillators.

Figure 1:
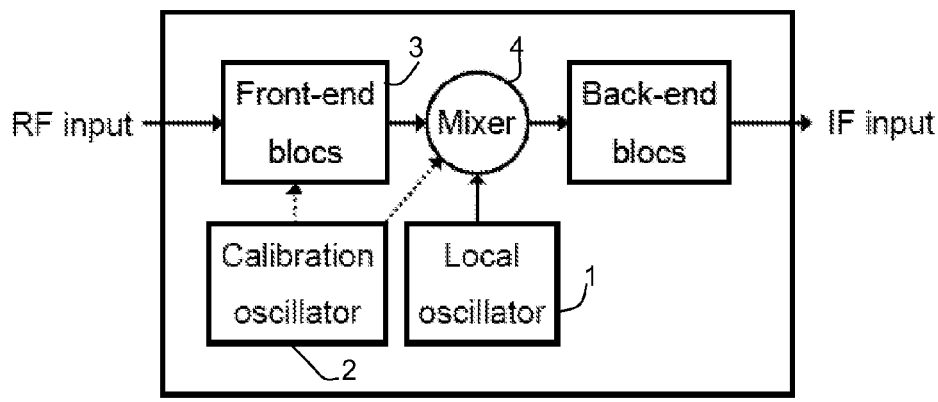
FIG. 1 shows a first known integrated circuit tuner using two local oscillators.

FIG. 1 shows a known single stream silicon tuner with some calibration features.

As shown, the tuner has two oscillators; a local oscillator 1 for the frequency down-mixing function and a calibration oscillator 2 which is used to process the RF input in front-end circuit blocks 3, and/or to calibrate the mixer 4. The calibration can for example comprising tuning filters in the front-end circuit blocks. As one example, the tuning can be for image rejection calibration with amplitude and phase mismatch correction.

Figure 2:
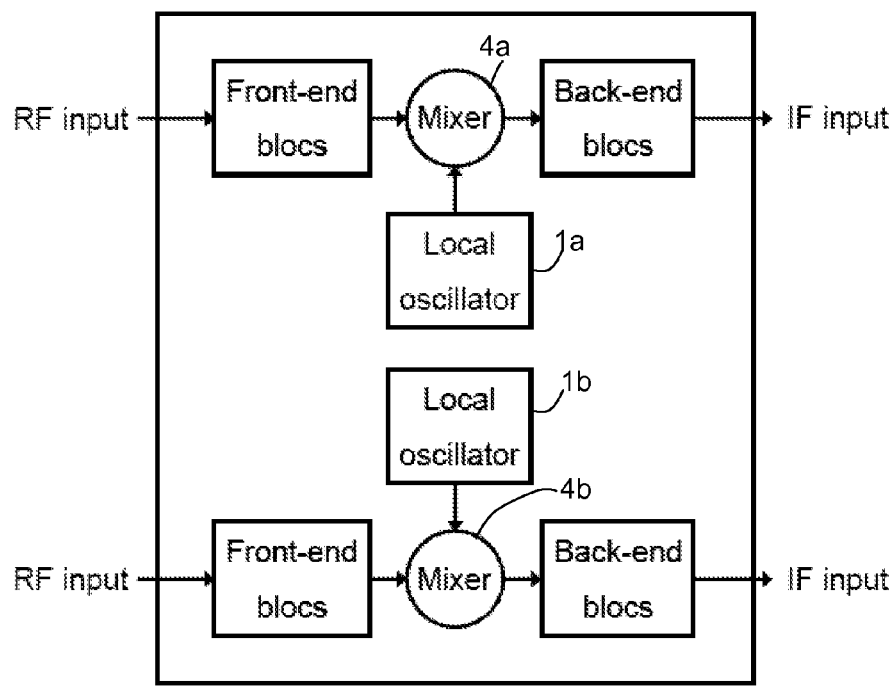
FIG. 2 shows a first known integrated circuit tuner using two local oscillators.

FIG. 2 shows a second example of tuner with multiple local oscillators, to implement a dual stream system.

Two oscillators are used 1a, 1b, each used as main local oscillator to feed a mixer.

This invention relates to any integrated circuit in which there are at least two local oscillators, and is not limited to the two examples above.

Figure 3:
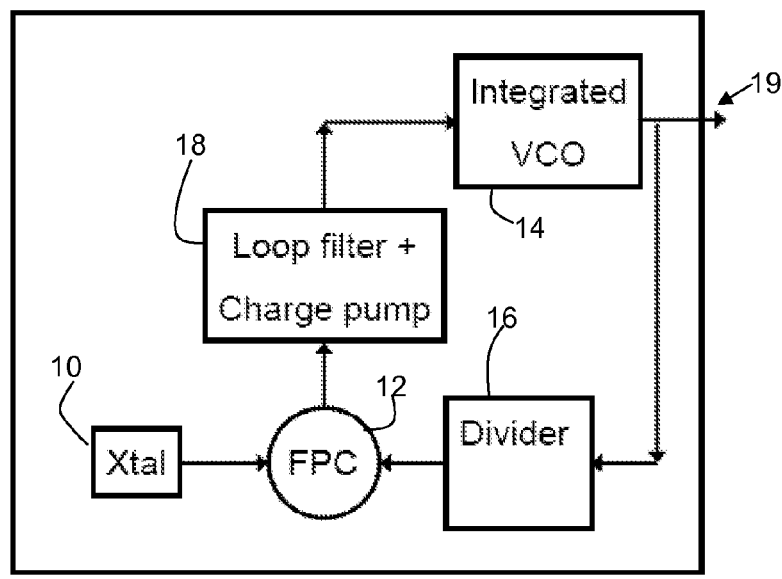
FIG. 3 shows an example of the components used in a local oscillator.

The components which make up a local oscillator are shown schematically in FIG. 3.

A crystal 10 provides the tuner reference frequency required for the particular application (for example an external surface mount device). The signal is provided to a Frequency and Phase Comparator (FPC) 12. An integrated Voltage Controlled Oscillator 14 generates an output signal, which is divided by the divider 16 (which will assumed to be the device to be tested), which then feeds the Frequency and Phase Comparator. The FPC compares the crystal reference signal with the VCO divided signal and supplies a control signal to a charge pump 18. The output signal of the charge pump is then filtered to drive the VCO.

The comparator, divider and charge pump/filter together define a feedback control circuit, and they implement a phase locked loop. The output frequency is equal to the crystal frequency multiplied by the division ratio implemented by the divider. The crystal oscillator can also be provided with a reference divider at its output, and this is a known further possibility in a standard phase locked loop architecture.

Figure 4:
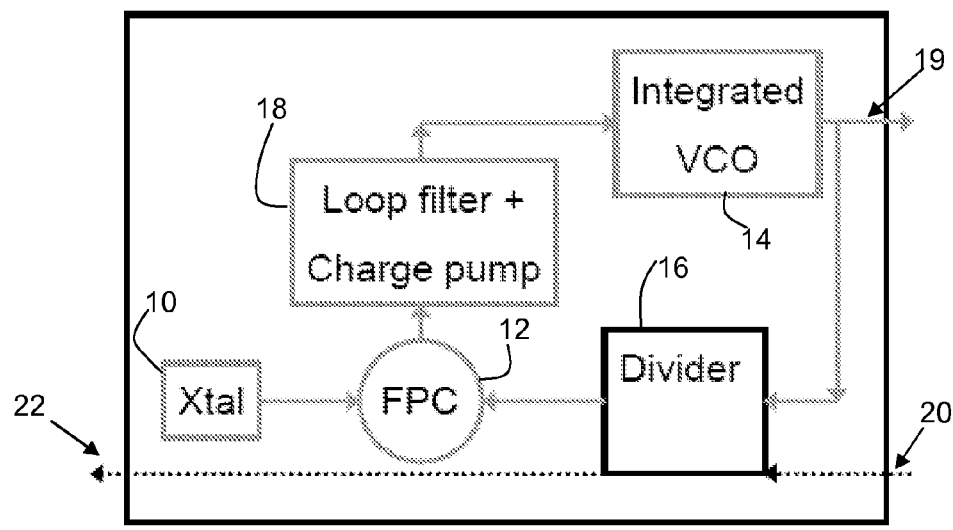
FIG. 4 shows the known way to test a component of the local oscillator (the frequency divider in this example)

When the divider is checked with traditional test methods, the connections shown in FIG. 4 are made.

The VCO signal 19 which would normally connect to the divider is replaced with a lower frequency external test signal 20 provided through the test pin. This is provided by an expensive RF option of the industrial tester. The divided signal is measured using a counter which receives the output 22 from the divider.

To feed the divider with the external reference signal, a dedicated test pin (one for each local oscillator) is required on the device package, thus increasing the product cost, especially in case that several oscillators are integrated in the IC. The connection from the industrial tester connector to the test pin also takes space on the test board, thus limiting the multi-site testing count. Preventing the test of several devices at the same time during the same test program run prevents test cost reduction, therefore also increasing product cost.

The invention provides an architecture in which the external reference signal is replaced by the output of another oscillator already integrated inside the product.

Figure 5:
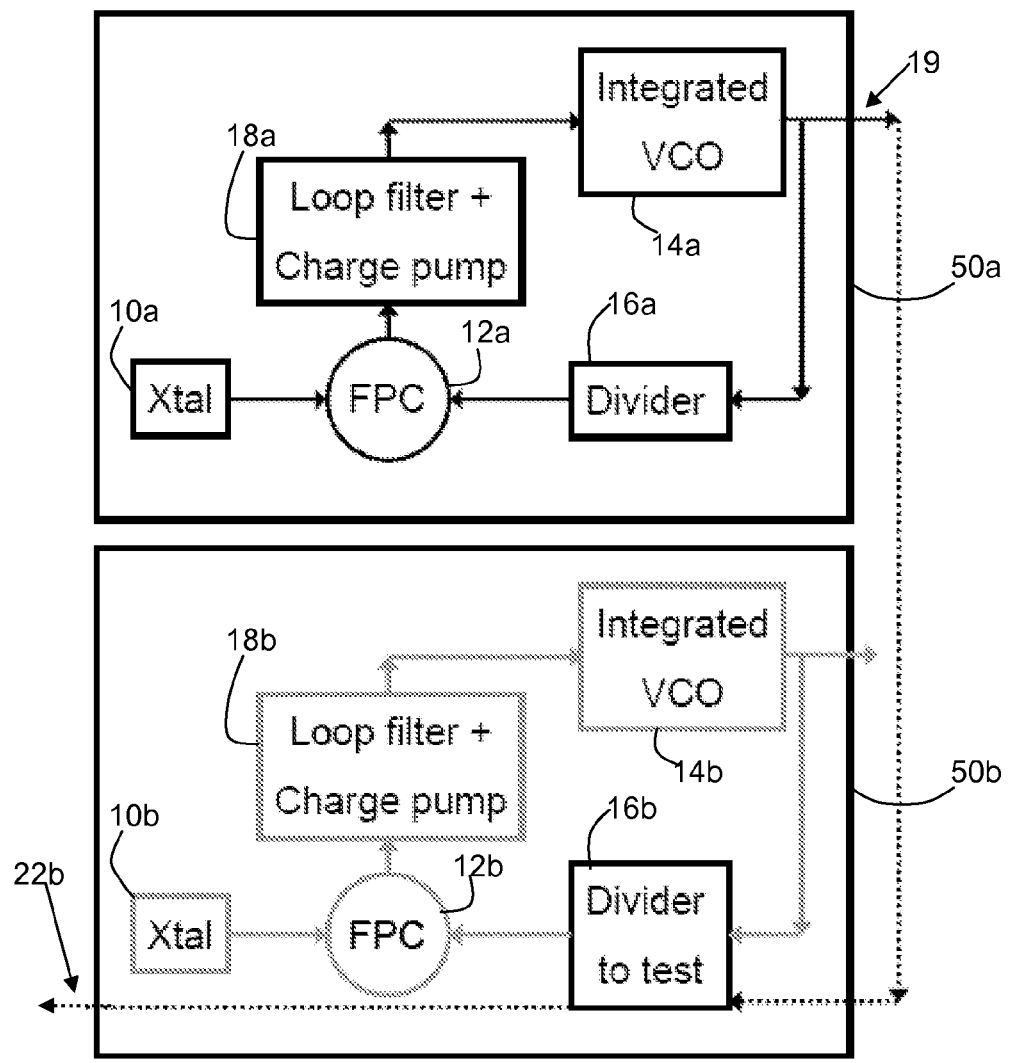
FIG. 5 shows an integrated circuit of the invention.

The approach of the invention is shown in FIG. 5.

The tuner comprises two local oscillators 50a, 50b, each having the configuration of FIG. 3. The same reference numerals have been used as in FIG. 3, with suffix "a" denoting components of the first local oscillator 50a and suffix "b" denoting components of the second local oscillator 50b.

As shown in FIG. 5, local oscillator 50a is providing a stable and known reference signal to the input of the divider 16b of the second local oscillator 50b.

The integrated Voltage Controlled Oscillator output of the first oscillator 50a is connected to the input of the divider 16b of the second oscillator, thus replacing the signal of the VCO 14b. It is assumed that the divider is again the device to be tested.

A special test mode, activated only during the industrial test of the divider, should control a switch between the integrated VCO 14b and the output of the VCO 14a of the other oscillator providing the reference signal. In the test mode, the output of VCO 14a is provided to the divider 16b, whereas in normal application mode the output of VCO 14b is provided to the divider 16b.

The required switch and the connection for controlling the switch are integrated inside the product. No dedicated test pin is required any more, allowing a smaller package to be used. Instead, the test mode is implemented by the IC controller, and the required control signal to initiate the test mode is provided to existing control pins of the IC. The device is for example controlled with an I2C bus, which can be also used for selecting the test modes, including the test mode implemented by this invention, thus removing the need for additional test pins.

The measurement performed remains unchanged: the output frequency of the divider 16b is measured using a frequency counter at output 22b. Then the ratio (input frequency/output frequency) can be verified to ensure proper divider function.

This arrangement removes the need for an expensive tester option to provide the RF reference signal, and also avoids adding specific test hardware (cables, switches, splitters, matching) on the test board, enabling more multi-site testing. The greatly contributes to reduce the cost of testing, therefore product cost and improves margins.

The frequency of an external reference signal provided by an industrial tester is limited to 6 GHz and even often to only 3 GHz. Silicon Tuner VCOs operate in the range of 6 to 9 GHz, and so does the divider input.

Therefore using an external reference does not allow testing the divider at its working conditions.

The arrangement above overcomes this issue as the reference signal is provided by another VCO of the IC, working within the same frequency range as the tested divider.

In case the product contains two oscillators, both should be equipped with such test modes. Thus, the roles of the two oscillators 50a, 50b can be reversed, and the circuit can be switched to provide the VCO output of the second oscillator 50b to the divider 16a. If the product contains more than two oscillators, then appropriate connections should be made to test each divider with another local oscillator providing the reference signal. The oscillators can be arranged in pairs, but other mappings between oscillators being tested and oscillators providing the RF test signal can be used.

The invention with the embodiments described above aims at reducing industrial test cost and improving product quality. It is of particular interest for divider tests, in products with several integrated local oscillators. The present invention can be used in Silicon Tuners (such as the TDA18271) with one main oscillator and a secondary oscillator used for calibration purposes (RF filters, image rejection improvement). It can also be used within dual path Silicon Tuners (such as the TDA18255) (one narrow channel path and a wide band channel path, requiring two mixers and two oscillators). Similarly, it is also applicable to full dual stream Silicon Tuners (such as the TDA18260).

Local oscillators are use in the up- and down-conversion of signals in transmitters and receivers, and this invention can be applied to all uses of local oscillator circuits.

The example above describes testing of the divider of the phase locked loop. However, other components can be tested using the RF signal, such as the FPC and the VCO. Furthermore, different frequency generating circuits (not PLL local oscillators as described) may be used.

In the examples above, each local oscillator has a reference frequency source in the form of a crystal oscillator. However, the reference frequency can be any form of reference signal, such as a voltage controlled crystal oscillator (VCXO), another IC, or indeed any externally provided reference signal. In the case of an externally provided reference signal, the "reference frequency source" of the IC is then an input pin to which the reference frequency signal is supplied. The claims should be construed accordingly.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A dual stream tuner integrated circuit comprising at least first and second frequency generating circuits, wherein each frequency generating circuit comprises:
    a reference frequency source;
    a voltage controlled oscillator; wherein the outputs of the voltage controlled oscillator of the first and second frequency generating circuits are provided to respective mixers for mixing an RF input signal stream to generate an intermediate frequency output signal stream; and
    a feedback control circuit for controlling the voltage controlled oscillator to provide a desired output frequency signal,
    wherein the integrated circuit comprises switching means for switching the output of the voltage controlled oscillator of the first frequency generating circuit into the feedback control circuit (12b, 16b, 18b) of the second frequency generating circuit to provide a test signal for testing one or more components of the feedback control circuit of the second frequency generating circuit.

2. A dual stream tuner integrated circuit as claimed in claim 1, wherein the feedback control circuit of each frequency generating circuit comprises a frequency divider which divides the voltage controlled oscillator output, and a comparator which compares the divider output with the reference frequency, wherein the output of the comparator is used to control the voltage controlled oscillator.

3. A dual stream tuner integrated circuit as claimed in claim 2, wherein the switching means is for switching the output of the voltage controlled oscillator of the first frequency generating circuit to the frequency divider of the second frequency generating circuit.

4. A dual stream tuner integrated circuit as claimed in claim 3 comprising an output to which the frequency divider output signal of the second frequency generating circuit is provided.

5. A dual stream tuner integrated circuit as claimed in claim 2, wherein the comparator comprises a phase and frequency comparator.

6. A dual stream tuner integrated circuit as claimed in claim 1 wherein the reference frequency source comprises a crystal oscillator.

7. A dual stream tuner integrated circuit as claimed in claim 1, wherein the switching means comprises a switch for selecting a signal to switch into the feedback control circuit.

8. A method of testing one or more components of a second frequency generating circuit of a dual stream tuner integrated circuit which has first and second frequency generating circuits, wherein each frequency generating circuit comprises a reference frequency source, a voltage controlled oscillator with the output of the voltage controlled oscillator of the first and second frequency generating circuits provided to respective mixers for mixing an RF input signal stream to generate an intermediate frequency output signal steam, and a feedback control circuit for controlling the voltage controlled oscillator to provide a desired output frequency signal,
    wherein the method comprises:
    switching the output of the first frequency generating circuit into the feedback control circuit of the second frequency generating circuit to provide a test signal for testing one or more components of the feedback control circuit of the second frequency generating circuit; and
    analyzing the response of the one or more components of the feedback control circuit to the test signal.

9. A method as claimed in claim 8, comprising testing a frequency divider.

10. A method as claimed in claim 9, comprising switching the output of a voltage controlled oscillator of the first frequency generating circuit to the frequency divider of the second frequency generating circuit.

* * * * *